United States Patent [19]

Kusakabe et al.

[11] Patent Number: 4,462,005

[45] Date of Patent: Jul. 24, 1984

[54] CURRENT MIRROR CIRCUIT

[75] Inventors: Hiromi Kusakabe; Yoshihiro Yoshida, both of Yokohama, Japan

[73] Assignee: Tokyo Shibaura Denki Kabushiki Kaisha, Kawasaki, Japan

[21] Appl. No.: 387,750

[22] Filed: Jun. 11, 1982

[30] Foreign Application Priority Data

Jun. 15, 1981 [JP] Japan .................................. 56-91992

[51] Int. Cl.$^3$ .................................................. H03F 3/04

[52] U.S. Cl. ....................................................... 330/288

[58] Field of Search ................. 330/288; 323/315, 316

[56] References Cited

U.S. PATENT DOCUMENTS 3,813,607 5/1974 Voorman ............................ 330/288

FOREIGN PATENT DOCUMENTS 3114877 2/1982 Fed. Rep. of Germany ...... 323/288

*Primary Examiner*—James B. Mullins

*Assistant Examiner*—G. Wan

*Attorney, Agent, or Firm*—Cushman, Darby & Cushman

[57] ABSTRACT

A current mirror circuit in which error between input current and output current is small and which can operate with low voltage. First and second current mirror transistors of a first conductivity type have their emitters each connected to a power supply, their bases connected together and their collectors connected to an input terminal and an output terminal respectively. A current amplification factor compensating third transistor of the first conductivity type is provided which has its emitter connected to the bases of the first and second transistors and its collector connected to a reference potential point. A fourth transistor of a second conductivity type is provided for level shifting. This transistor has its collector connected to the emitters of the first and second transistors, its emitter connected to the base of the third transistor and its base connected to the collector of the first transistor. A current source is connected between the third transistor and the reference potential point.

3 Claims, 6 Drawing Figures

CURRENT MIRROR CIRCUIT

BACKGROUND OF THE INVENTION

This invention relates to a current mirror circuit suitable for a low voltage integrated circuit.

A current mirror circuit is usually used as an active load of a differential amplifier, and various types of current mirror circuits are known. FIGS. 1(a) to 1(c) show examples of such known current mirror circuits.

FIG. 1(a) shows a known current mirror circuit which has transistors Qa1 and Qa2 with their respective base-emitter paths connected in parallel. This circuit arrangement has a drawback in that an error of a comparatively large magnitude is provided between an input current Iin and an output current Iout due to the base current of transistors Qa1 and Qa2 as is well known in the art.

FIG. 1(b) is an improved current mirror circuit which comprises a compensating transistor Qb3 of the same conductivity type to transistors Qb1 and Qb2. The transistor Qb3 has its emitter connected to the bases of transistors Qb1 and Qb2, its base connected to the collector of transistor Qb1 and its collector connected to circuit ground. According to this circuit arrangement, the effect of the base current of transistors Qb1 and Qb2 on the input current Iin can be reduced by a factor of the current amplification factor of transistor Qb3. In this circuit, however, a supply voltage at the input terminal supplied with the input current Iin must be lower than Vcc by the sum of the base-emitter voltages (about 0.7 volt in case of a silicon transistor) of transistors Qb1 and Qb3. This involves a disadvantage that a relatively high supply voltage, which is about 1.4 volts or above, is necessary for operating the circuit.

FIG. 1(c) shows still another improved current mirror circuit. This circuit comprises emitter-coupled NPN transistors Qc3 and Qc4 in addition to current mirror PNP transistors Qc1 and Qc2. Transistor Qc3 has its collector connected to a supply voltage Vcc and its base connected to the collector of transistor Qc1. On the other hand, transistor Qc4 has its collector connected to the bases of transistors Qc1 and Qc2 and its base connected to a reference voltage Vref. The emitters of transistors Qc3 and Qc4 are connected through a current source of current value IO to circuit ground. The current IO is set to be higher than the sum of the base currents of transistors Qc1 and Qc2.

With this circuit the error between the input current Iin and the output current Iout is IO/$\beta$3 at maximum ($\beta$3 is the current amplification factor of transistor Qc3). It will be understood that, since IO is relatively low, the error is small. Transistor Qc3 is provided for the level shift, and thus the supply voltage at the input terminal is determined by Vref. Namely, the circuit of FIG. 1(c) can be operated from a low supply voltage so long as Vref has such a magnitude to render all the transistors conductive. However, this circuit arrangement is complicated in construction in that the generation of the reference voltage Vref applied to the base of transistor Qc4 is required.

SUMMARY OF THE INVENTION

An object of the invention is to provide a current mirror circuit, in which the error between an input current and an output current is small, and which can operated from a low supply voltage and is simple in construction.

In accordance with this invention, in a current mirror circuit which comprises first and second transistors of a first conductivity type having their emitters each connected to a power supply, their bases connected together and their collectors respectively connected to an input terminal and an output terminal, and a third transistor of the first conductivity type having its emitter connected to the bases of the first and second transistors, its collector connected to a reference potential point and its base connected to the collector of the first transistor, a fourth transistor of a second conductivity type complementary to the first conductivity type is provided which has its collector connected to the power supply, its emitter connected to the base of the third transistor and its base connected to the collector of the first transistor, and a current source is connected between the base of the third transistor and the reference potential point.

DETAILED DESCRIPTION OF THE PREFERRED EMBODIMENTS

Figure 2:
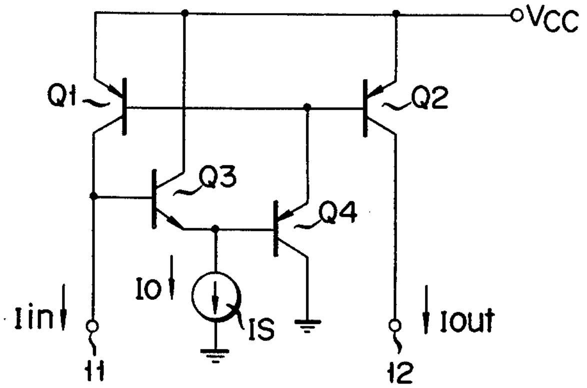
FIGS. 2 to 4 are circuit diagrams of current mirror circuits according to the invention.

FIG. 2 shows a current mirror circuit embodying the invention. Like the well-known circuit, current mirror transistors Q1 and Q2 of PNP type are provided with their emitters connected to a voltage source Vcc and their bases connected together. The collectors of transistors Q1 and Q2 are respectively connected to an input terminal 11, supplied with an input current Iin and an output terminal 12 from which output current Iout is led out. A PNP transistor Q4 is provided for current amplification factor compensation. This transistor Q4 has its emitter connected to the bases of transistors Q1 and Q2 and its collector connected to a reference potential (circuit ground). An NPN transistor Q3 is provided for level shifting, which has its collector connected to voltage source Vcc, its emitter connected to the base of transistor Q4 and its base connected to the collector of transistor Q1. Between the base of transistor Q4 and circuit ground is connected a current source IS for providing current IO. The magnitude of IO is set greater than the base current of transistor Q4.

Figure 1A:
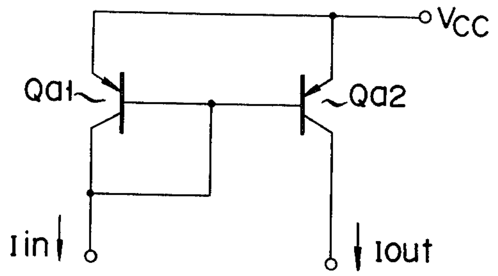
FIG. 1A (PRIOR ART)
FIGS. 1(a) to 1(c) are circuit diagrams of prior art current mirror circuits.
Figure 1B:
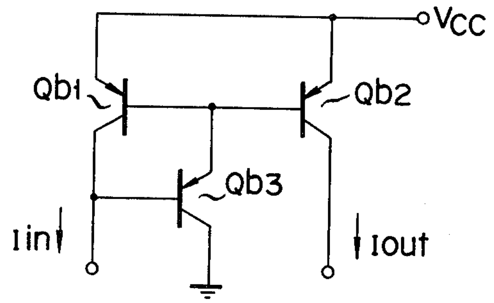
FIG. 1B (PRIOR ART)
Figure 1C:
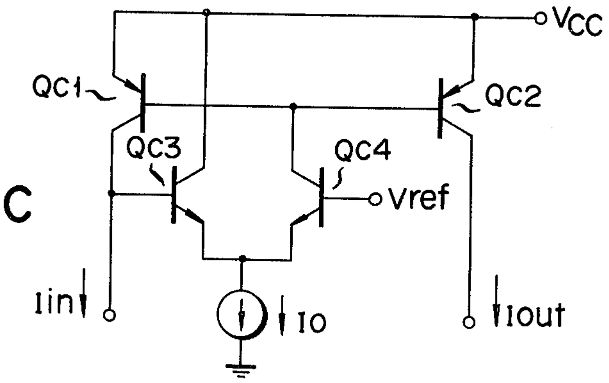
FIG. 1C (PRIOR ART)

According to this circuit arrangement, the current IO of current source IS is set as follows:

$$IO > \frac{Iout}{\beta 1 \times \beta 2}$$

where $\beta$1 is the current amplification factor of current mirror transistors Q1 and Q2 and $\beta$2 is the current amplification factor of transistor Q4. Namely, the current IO of current source IS can be set 1/$\beta$ lower than in the prior art circuit of FIG. 1(c). This means that the base current of transistor Q3 which causes an error can be reduced. Further, since the level shifting transistor Q3 is provided, the voltage level at input terminal 11 may be lower than Vcc by the base-to-emitter voltage $V_{BE}$ of a single transistor (about 0.7 volt). This means that the current mirror circuit of the invention can be operated from a relatively low supply voltage.

Figure 3:
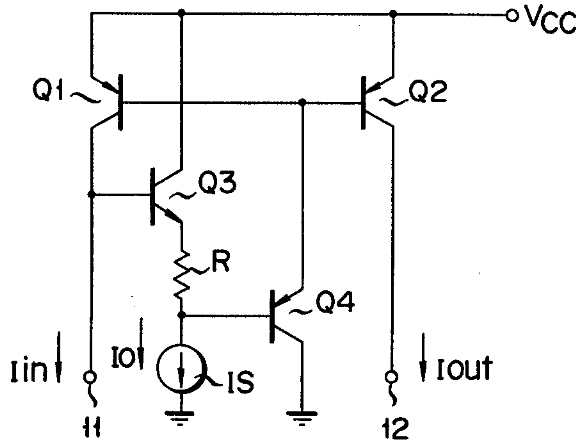

FIG. 3 shows another arrangement of the current mirror circuit of the invention in which a resistor R is connected between the emitter of transistor Q3 and the base of transistor Q4. With this circuit arrangement, the level shift voltage can be increased up to $V_{BE}+IOR$. Namely, the voltage loss of this circuit becomes $V_{BE}-IOR$ and the loss voltage can be reduced to the level just prior to the saturation of first transistor Q1. Therefore, the circuit can be operated from a supply voltage lower than the circuit of FIG. 2.

Figure 4:
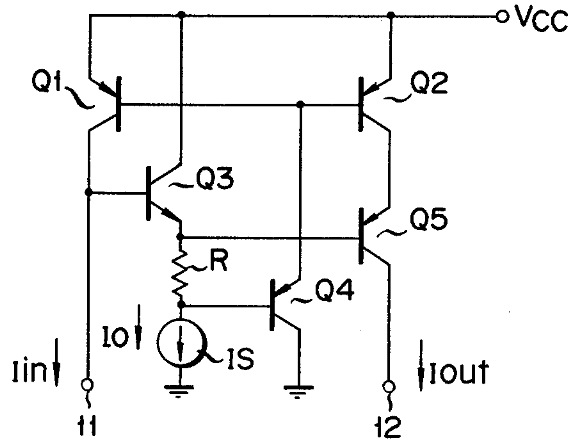

FIG. 4 shows still another arrangement of the invention in which a PNP transistor Q5 is provided for improving the linearity of the current mirror circuit by reducing the Early effect of transistor. Transistor Q5 has its emitter connected to the collector of transistor Q2, its collector connected to output terminal 12 and its base connected to the emitter of transistor Q3. According to an experiment using such circuit arrangement in which the collector-emitter voltage $V_{CE}$ of transistor Q2 is 0.3 volt, the bias current in a zero-signal condition 200 microamperes and the signal amplitude 100 microamperes, the total harmonic distortion at 1 kHz was 0.1%. With the circuit of FIG. 3, the total harmonic distortion is 3%.

What we claim is:

1. A current mirror circuit comprising:

a first transistor of a first conductivity type having a first emitter, a first base and a first collector, the first emitter and first collector being connected to a power supply and a current input terminal, respectively;

a second transistor of the first conductivity type having a second emitter, a second base and a second collector, the second emitter, second collector and second base being connected to the power supply, a current output terminal and the first base, respectively;

voltage level shift means including a third transistor of the first conductivity type having a third emitter, a third base and a third collector, the third emitter being connected to the bases of said first and second transistors and the third collector being connected to a reference potential;

a fourth transistor of a second conductivity type having a fourth emitter, a fourth base and a fourth collector, the fourth collector, the fourth emitter and the fourth base being connected to the power supply, the third base and the first collector, respectively;

a current source connected between the reference potential and the third base; and a resistor connected between the emitter of said fourth transistor and the base of said third transistor.

2. The current mirror circuit according to claim 1 wherein a fifth transistor of the first conductivity type is provided which has its emitter connected to the collector of said second transistor, its collector connected to said output terminal and its base connected to the emitter of said fourth transistor.

3. The current mirror circuit according to claim 1 or 2 wherein the first conductivity type is PNP type and the second conductivity type is NPN type.

* * * * *